United States Patent
Warren et al.

(10) Patent No.: US 10,256,093 B2
(45) Date of Patent: Apr. 9, 2019

(54) SELECTIVE AREA GROWTH OF SEMICONDUCTORS USING PATTERNED SOL-GEL MATERIALS

(71) Applicant: Alliance for Sustainable Energy, LLC, Golden, CO (US)

(72) Inventors: Emily L. Warren, Golden, CO (US); Adele Clare Tamboli, Golden, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 15/362,420

(22) Filed: Nov. 28, 2016

(65) Prior Publication Data
US 2017/0154771 A1 Jun. 1, 2017

Related U.S. Application Data (60) Provisional application No. 62/260,728, filed on Nov. 30, 2015.

(51) Int. Cl.
*H01L 21/02* (2006.01)

(52) U.S. Cl.
CPC .... *H01L 21/02647* (2013.01); *H01L 21/0262* (2013.01); *H01L 21/02381* (2013.01); *H01L 21/02546* (2013.01); *H01L 21/02639* (2013.01); *H01L 21/02642* (2013.01)

(58) Field of Classification Search
CPC .......... H01L 21/02647; H01L 21/3105; H01L 21/02345; H01L 21/02164; H01L 21/02381; H01L 21/02546; H01L 21/02639; H01L 21/02642; H01L 21/0262
See application file for complete search history.

(56) References Cited

U.S. PATENT DOCUMENTS

| | | | | |
|---|---|---|---|---|
| 4,826,784 A | * | 5/1989 | Salerno | H01L 21/02381 117/95 |
| 4,876,210 A | * | 10/1989 | Barnett | H01L 21/02381 117/58 |
| 5,356,509 A | * | 10/1994 | Terranova | H01L 21/02381 117/56 |
| 5,548,154 A | * | 8/1996 | Miller | H01L 21/76245 257/506 |
| 9,048,097 B2 | | 6/2015 | Warren et al. | |
| 9,378,950 B1 | * | 6/2016 | Lee | H01L 21/3081 |
| 2001/0031384 A1 | * | 10/2001 | Bojarczuk, Jr. | G11B 5/7325 428/831 |

(Continued)

OTHER PUBLICATIONS

Almansouri et al., "Supercharging Silicon Solar Cell Performance by Means of Multijunction Concept," IEEE Journal of Photovoltaics, vol. 5, No. 3, May 2015, pp. 968-976.

(Continued)

*Primary Examiner* — Thanh Y. Tran
(74) *Attorney, Agent, or Firm* — Sam J. Barkley (57) ABSTRACT

Systems and methods for growing semiconductor materials on substrates by using patterned sol-gel materials are provided. According to a first aspect of the invention, a method includes forming a pattern of a sol-gel material on a first region of substrate, and depositing a semiconductor material on a second region of the substrate by selective area growth. The second region is adjacent to the first region.

15 Claims, 8 Drawing Sheets

(56) References Cited

U.S. PATENT DOCUMENTS

| | | | | |
|---|---|---|---|---|
| 2014/0057416 A1* | 2/2014 | Warren | ............... | H01L 21/0259 438/478 |
| 2014/0357063 A1* | 12/2014 | Lee et al. | .......... | H01L 21/02647 438/481 |
| 2015/0115277 A1* | 4/2015 | Motsnyi | ............ | H01L 21/02458 257/76 |

OTHER PUBLICATIONS

Andre et al., "Investigations of High-Performance GaAs Solar Cells Grown on Ge—$Si_{1-x}Ge_x$—Si Substrates," IEEE Transactions on Electron Devices, vol. 52, No. 6, Jun. 2005, pp. 1055-1060.

Audesirk et al., "Ordered Silicon Microwire Arrays Grown from Substrates Patterned Using Imprint Lithography and Electrodeposition," Applied Materials & Interfaces, vol. 7, 2015, pp. 1396-1400.

Beaumont et al., "Epitaxial Lateral Overgrowth of GaN," Physica Status Solidi(b), vol. 227, No. 1, 2001, pp. 1-43.

Cheng et al., "Selective area metalorganic vapor-phase epitaxy of gallium arsenide on silicon," Journal of Crystal Growth, vol. 310, No. 3, 2008, pp. 562-569.

Essig et al., "Progress towards a 30% efficient GaInP/Si tandem solar cell," Energy Procedia, vol. 77, Aug. 2015, pp. 464-469.

Essig et al., "Wafer-Bonded GaInP/GaAs//Si Solar Cells With 30% Efficiency Under Concentrated Sunlight," IEEE Journal of Photovoltaics, vol. 5, No. 3, May 2015, pp. 977-981.

Essig et al., "Realization of GaInP/Si Dual-Junction Solar Cells With 29.8% 1-Sun Efficiency," IEEE Journal of Photovoltaics, vol. 6, No. 4, Jul. 2016, pp. 1012-1019.

Ferry et al., "Light trapping in ultrathin plasmonic solar cells," Optics Express A237, vol. 18, No. S2, Jun. 21, 2010, pp. 1-9.

Garcia-Tabares et al., "Evolution of silicon bulk lifetime during III-V-on-Si multijunction solar cell epitaxial growth," Progress in Photovoltaics: Research and Applications, vol. 24, 2016, pp. 634-644.

Geisz et al., "Lattice-mismatched GaAsP Solar Cells Grown on Silicon by OMVPE," 4th World Conference on Photovoltaic Energy Conversion, May 7-12, 2006, pp. 1-21.

Grassman et al., "GaAsP/Si Dual-Junction Solar Cells Grown by MBE and MOCVD," Journal of Photovoltaics, Photovoltaic Specialist Conference, Jun. 14-19, 2015, pp. 1-5.

He et al., "Selective area growth of GaAs on silicon," Asia Communications and Photonics Conference, Nov. 11-14, 2014, Optical Society of America publishing, pp. 1-3.

Hsu et al., "Nano epitaxial growth of GaAs on Si(001)," Applied Physics Letters, vol. 99, 2011, pp. 133115-1-133115-3.

Hsu et al., "Nanoepitaxy of GaAs on a Si(001) substrate using a round-hole nanopatterned $SiO_2$ mask," Nanotechnology, vol. 23, No. 49, Oct. 19, 2012, pp. 1-6.

Jain et al., "III-V Multijunction Solar Cell Integration with Silicon: Present Status, Challenges and Future Outlook," Energy Harvesting and Systems, vol. 1, No. 3-4, 2014, pp. 121-145.

Jones-Albertus et al., "Technology advances needed for photovoltaics to achieve widespread grid price parity," Progress in Photovoltaics: Research and Applications, vol. 24, Issue 9, Apr. 20, 2016, pp. 1272-1283.

Lan, H., "Soft UV Nanoimprint Lithography and Its Applications," Nanotechnology and Nanomaterials, Updates in Advanced Lithography, Chapter 7, Jul. 3, 2013, pp. 169-195.

Lee et al., "Lithography-free Nanoscale Patterned Growth of GaAs on Si(001) with Sub-100-nm Silica Nanoparticles by Molecular Beam Epitaxy," Crystal Growth & Design, vol. 11, 2011, pp. 3673-3676.

Li et al., "Growing antiphase-domain-free GaAs thin films out of highly ordered planar nanowire arrays on exact (001) silicon," Applied Physics Letters, vol. 106, No. 7, Feb. 20, 2015, pp. 072105-1-072105-4.

Luryi et al., "New approach to the high quality epitaxial growth of lattice-mismatched materials," Applied Physics Letters, vol. 49, No. 3, Jul. 21, 1986, pp. 140-142.

Martinez et al., "Development of $ZnSiP_2$ for Si-Based Tandem Solar Cells," IEEE Journal of Photovoltaics, vol. 5, No. 1, Jan. 2015, pp. 17-21.

McMahon et al., "Surfaces and interfaces governing the OMVPE growth of APD-free GaP on $AsH_3$-cleaned vicinal Si(100)," Journal of Crystal Growth, vol. 452, Oct. 15, 2016, pp. 235-239.

Munshi et al., "Position-Controlled Uniform GaAs Nanowires on Silicon using Nanoimprint Lithography," Nano Letters, vol. 14, 2014, pp. 960-966.

Odom et al., "Generation of 30-50 nm Structures Using Easily Fabricated, Composite PDMS Masks," Journal of American Chemical Society, vol. 124, Jul. 10, 2002, pp. 12112-12113.

Orzali et al., "GaAs on Si epitaxy by aspect ratio trapping: Analysis and reduction of defects propagating along the trench direction," Journal of Applied Physics, vol. 118, No. 10, Sep. 14, 2015, pp. 105307-1-105307-9.

Peroz et al., "Nanopatterning of silica sol-gel thin films by soft thermal nanoimprint lithography," NSTI-Nanotech, vol. 4, 2007, pp. 450-452.

Soga et al., "MOCVD growth of high-quality AlGaAs on Si substrates for high-efficiency solar cells," Journal of Crystal Growth, vol. 170, 1997, pp. 447-450.

Soga et al., "MOCVD growth of high efficiency current-matched AlGaAs/Si tandem solar cell," Journal of Crystal Growth, vol. 174, 1997, pp. 579-584.

Spinelli et al., "$Al_2O_3/TiO_2$ nano-pattern antireflection coating with ultralow surface recombination," Applied Physics Letters, vol. 102, No. 23, Jun. 11, 2013, pp. 233902-1-233902-4.

Tamboli et al., "III-V/Si wafer bonding using transparent, conductive oxide interlayers," Applied Physics Letters, vol. 106, No. 26, Jul. 2, 2015, pp. 263904-1-263904-4.

Tanabe et al., "III-V/Si hybrid photonic devices by direct fusion bonding," Scientific Reports, vol. 2, No. 349, Apr. 2, 2012, pp. 1-6.

Verschuuren et al., "3D Photonic Structures by Sol-Gel Imprint Lithography," Materials Research Society Symposium Proceedings, vol. 1002, 2007, pp. 1-6.

Verschuuren et al., "Large-area nanopatterns: improving LEDs, lasers, and photovoltaics," SPIE Newsroom, 2012, pp. 1-3.

Verschuuren, M., "Substrate Conformal Imprint Lithography for Nanophotonics," Ph.D. Thesis, Utrecht University, Mar. 2010, pp. 1-138.

Warren et al., "Growth of antiphase-domain-free GaP on Si substrates by metalorganic chemical vapor deposition using an in situ $AsH_3$ surface preparation," Applied Physics Letters, vol. 107, No. 8, Aug. 28, 2015, pp. 082109-1-082109-4.

Yamaguchi, "Dislocation density reduction in heteroepitaxial III-V compound films on Si substrates for optical devices," Journal of Materials Research, vol. 6, No. 2, Feb. 1991, pp. 376-384.

Zang et al., "Nanoscale lateral epitaxial overgrowth of GaN on Si(111)," Applied Physics Letters, vol. 87, No. 19, Nov. 3, 2005, pp. 193106-1-193106-3.

* cited by examiner

SELECTIVE AREA GROWTH OF SEMICONDUCTORS USING PATTERNED SOL-GEL MATERIALS

CROSS-REFERENCE TO RELATED APPLICATION

This application claims priority under 35 U.S.C. § 119 to U.S. Provisional Patent Application No. 62/260,728, filed on Nov. 30, 2015, the contents of which are hereby incorporated by reference in their entirety.

CONTRACTUAL ORIGIN

The United States Government has rights in this invention under Contract No. DEAC36-08GO28308 between the United States Department of Energy and the Alliance for Sustainable Energy, LLC, the Manager and Operator of the National Renewable Energy Laboratory.

BACKGROUND OF THE INVENTION

The present invention relates to growing semiconductors on substrates having a patterned sol-gel material. The ability to pattern nucleation areas for semiconductor growth by metalorganic chemical vapor deposition (MOCVD) or other growth techniques has applications in complementary metal-oxide semiconductor (CMOS) devices and heteroepitaxy. One approach to the heteroepitaxial growth of lattice mismatched semiconductors is the use of selective area growth (SAG), which has applications in forming high efficiency multijunction solar cells. Further, the SAG technique has been used for the growth of wurtzite III-V semiconductors, such as GaN, on foreign 5 substrates to make light-emitting diodes (LEDs).

While many attempts have been made to grow zinc-blende III-V semiconductors, such as GaAs, on Si (with a diamond crystal structure) using the SAG technique, none have been proven to be industrially feasible. One challenge is that the techniques traditionally used to define regions for SAG, such as e-beam lithography and reactive ion etching (RIE), are too expensive to be scaled to manufacturing. Accordingly, it would be advantageous to provide a method of growing high-quality semiconductor materials, such as GaAs, on lattice mismatched substrates at a lower cost than previous methods.

SUMMARY OF THE INVENTION

Exemplary embodiments of the invention provide systems and methods for growing 2 semiconductor materials on 5 substrates by using patterned 7 sol-gel materials. According to a first aspect of the invention, a method includes forming a 1 pattern of a 7 sol-gel material on a 3 first region of 5 substrate; and depositing a 2 semiconductor material on a 4 second region of the 5 substrate by selective area growth, wherein the 4 second region is adjacent to the 3 first region.

The depositing of the 2 semiconductor material may include nucleating the 2 semiconductor material at a growth rate between 0.5 and 2.0 microns per hour and a V/III ratio between 10 and 250. The depositing of the 2 semiconductor material may also include forming a condensed film of the 2 semiconductor material within the 4 second region, after the nucleating of the 2 semiconductor material.

The method may also include forming a 6 continuous film of the 2 semiconductor material, such that the film extends over the 3 first region and the 4 second region, by lateral overgrowth of the 2 semiconductor material, after the depositing of the 2 semiconductor material on the 4 second region. The forming of the 6 continuous film of the 2 semiconductor material may include, after the depositing of the 2 semiconductor material on the 4 second region of the 5 substrate, increasing a temperature of the 5 substrate; and growing the 2 semiconductor material at a growth rate between 1 and 20 microns per hour and a V/III ratio between 100 and 500.

The forming of the pattern of the 7 sol-gel material may include coating the 7 sol-gel material onto the 5 substrate; stamping the 7 sol-gel material with 8 a polymer stamp; and annealing the 7 sol-gel material.

The 2 semiconductor material may be deposited and the film may be formed by chemical vapor deposition. For example, the 2 semiconductor material may be deposited and the film may be formed by metalorganic chemical vapor deposition.

The 2 semiconductor material and the 5 substrate may be different materials. The 2 semiconductor material may include a III-V material. For example, the 2 semiconductor material may include GaAs. Further, the 5 substrate may include Si.

The method may also include, before the forming of the pattern of the 7 sol-gel material, forming a 9 protective layer on the 3 first region and the 4 second region of the 5 substrate. In addition, the method may also include, after the forming of the pattern of the 7 sol-gel material, 10 removing the protective layer from the second region of the substrate. The 9 protective layer may be a passivating layer.

The method may also include, after the forming of the pattern of the 7 sol-gel material, increasing a density of the 7 sol-gel material by heating the 7 sol-gel material. Further, the method may also include, after the forming of the pattern of the 7 sol-gel material, performing a dilute HF etch to remove native oxide from the 7 sol-gel material. The 2 semiconductor material may be uncatalyzed.

Other objects, advantages, and novel features of the present invention will become apparent from the following detailed description of the invention when considered in conjunction with the accompanying drawings.

DETAILED DESCRIPTION OF EXEMPLARY EMBODIMENTS

Exemplary embodiments of the present invention provide a low-cost approach to patterning a dielectric material on a 5 substrate that controls the area where other semiconductors are able to nucleate on the 5 substrate. Specifically, a 7 sol-gel material is used to form a pattern to control where a 2 semiconductor material is grown on a 5 substrate. The patterned material may be a solution of alkoxide precursors that react through a hydrolysis reaction to produce a low-quality silica (SiOx) matrix. The gel formed from this reaction turns into a solid when dried and its chemical and optical properties approach those of $SiO_2$ upon annealing.

Using a buffer layer prepared through a sol-gel process for patterned growth has several advantages over the related art 7 sol-gel materials can be made from inexpensive precursors, and spun or coated onto 5 substrates without the need for specialized equipment, unlike the deposition of a dielectric layer or the growth of an oxide. Silica-based 7 sol-gel materials can be etched with hydrofluoric acid (HF) or with reactive ion etching (RIE) without leaving any chemical residue that could impact material quality. Further, 7 sol-gel materials can be patterned using inexpensive and scalable nanoimprint lithography.

A material system that is of great interest for both the photovoltaic and CMOS communities is the growth of GaAs on Si. Prior attempts at SAG of GaAs on Si have used patterned $SiO_2$, $SiN_x$, or silica nanospheres as patterning layers. However, the growth methods used to form these patterning layers are expensive and time-consuming. Further, it is unclear if any of these approaches have resulted in high quality GaAs devices.

In one example, the present invention may use nanoimprint lithography to pattern a Si 5 substrate with a 7 sol-gel material that enables SAG of GaAs on Si by MOCVD. This technique may also be applied to other lattice mismatched semiconductor 5 substrates, epitaxial layers, and growth methods. This is the first demonstration that an imprint-patternable 7 sol-gel material can be used to define growth regions of III-V semiconductors by MOCVD.

Figure 1:
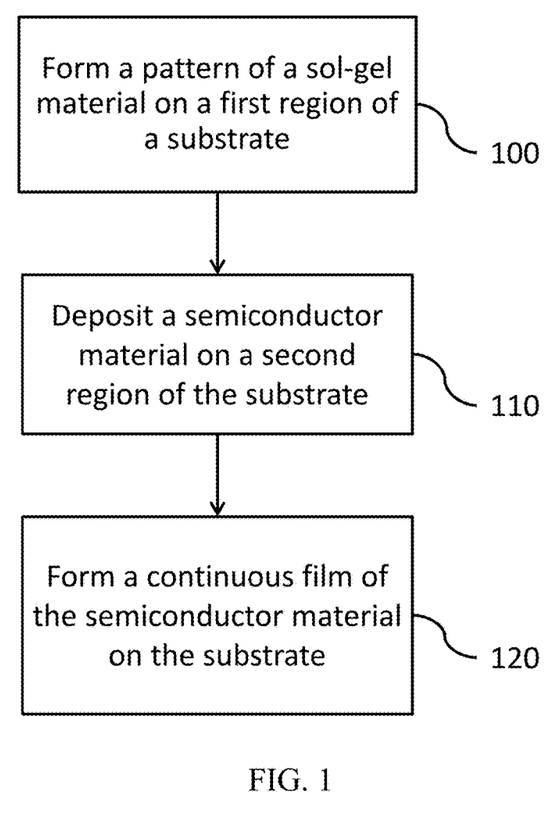
FIG. 1 shows a flowchart of an exemplary embodiment of a method for growing a 2 semiconductor material on a lattice mismatched 5 substrate.
Figure 2:
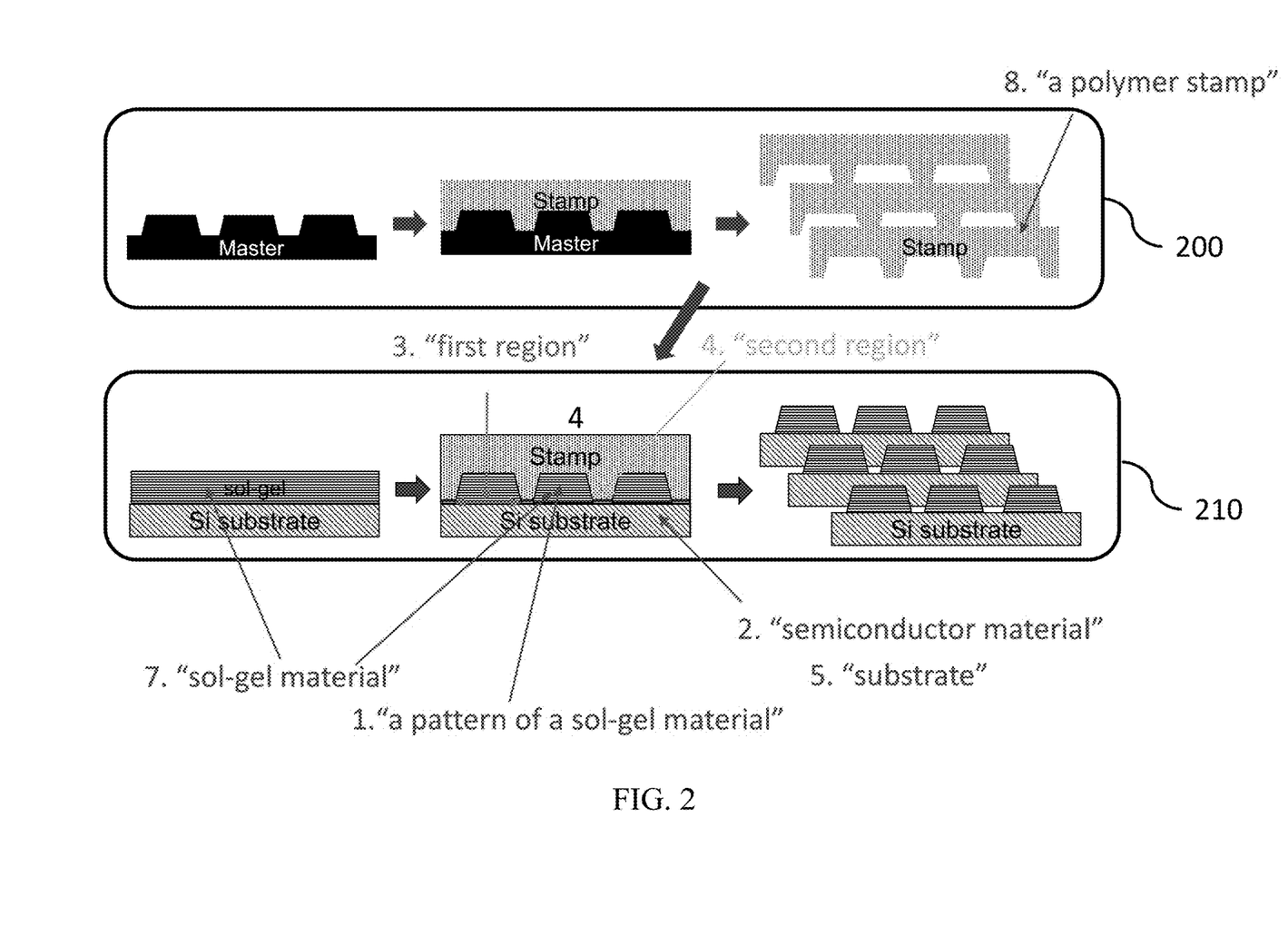
FIG. 2 shows an example of soft nanoimprint lithography (SNIL) and 2 semiconductor material; a first region; 4 a second region; 5 a substrate; and 7 a sol-gel material.

FIG. 1 shows a flowchart of an exemplary embodiment of a method for growing a 2 semiconductor material on a lattice mismatched 5 substrate. As shown in FIG. 1, the method begins by forming a 1 pattern of a 7 sol-gel material on a 3 first region of a 5 substrate (100). The patterned 7 sol-gel material may be formed by any suitable technique, such as soft nanoimprint lithography (SNIL). As shown in FIG. 2, the SNIL method uses a master to create at least one stamp (200). For example, Si masters may be created by patterning wafers with deep ultraviolet (UV), interference, or e-beam lithography, followed by RIE. Then, bilayer polymer stamps made of polydimethylsiloxane (PDMS) may be fabricated by replicating the Si masters. Next, the SNIL method coats a 5 substrate with a 7 sol-gel material, and uses the stamp to imprint a pattern in the 7 sol-gel material on one or more coated 5 substrates (210). The 7 sol-gel material may be applied by spinning, printing, using a doctor blade, or any other suitable method.

The patterned 5 substrate may then be annealed to increase the density of the 7 sol-gel material. For example, the patterned 5 substrate may be annealed at an elevated temperature such as between 200° C. and 400° C. This may prevent the formation of pinholes in the 7 sol-gel material. Further, the patterned 5 substrate may be etched to remove residual 7 sol-gel material at the interface of the Si 5 substrate by using dilute (such as concentrations of <2% HF in $H_2O$) etching and/or dry etching. Although the 7 sol-gel material can be completely removed with HF, using optimized procedures of annealing the silica 7 sol-gel material and etching with dilute HF enables control of the etch rate such that any thin residue of the resist material can be fully removed, as well as any native $SiO_2$ formed on the Si surface due to exposure to air, while leaving the desired pattern of the 7 sol-gel material. This may be accomplished by controlling the temperature, time, and HF concentration. Surface analysis techniques, such as atomic force microscopy (AFM) or Auger spectroscopy, may be used to confirm that all 7 sol-gel material is removed from the exposed Si areas prior to the growth of the 2 semiconductor material.

Figure 3:
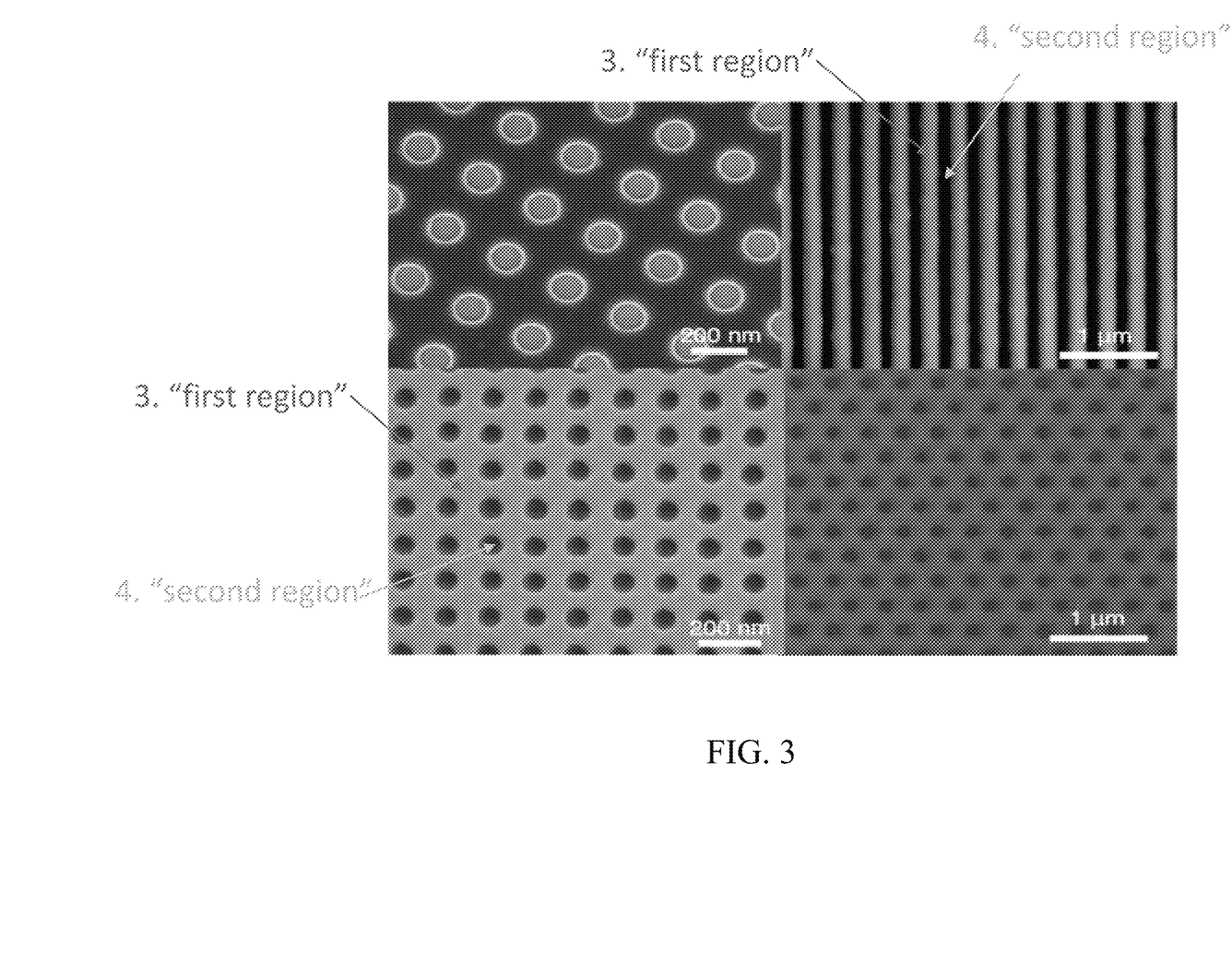
FIG. 3 shows scanning electron microscope (SEM) images of 7 sol-gel material patterned on Si 5 substrates; 3 first region; and 4 second region.

FIG. 3 shows scanning electron microscope (SEM) images of 7 sol-gel material patterned on Si 5 substrates according to the methods discussed above. As shown in FIG. 3, a variety of different lateral and vertical feature sizes may be patterned by using different patterned masters and 7 sol-gel material thicknesses. The SNIL method is cost-effective and scalable. It may be possible to transfer features as small as 10 nm to the 7 sol-gel material. In addition, the SNIL method can be used in roll-to-roll applications.

Figure 4:
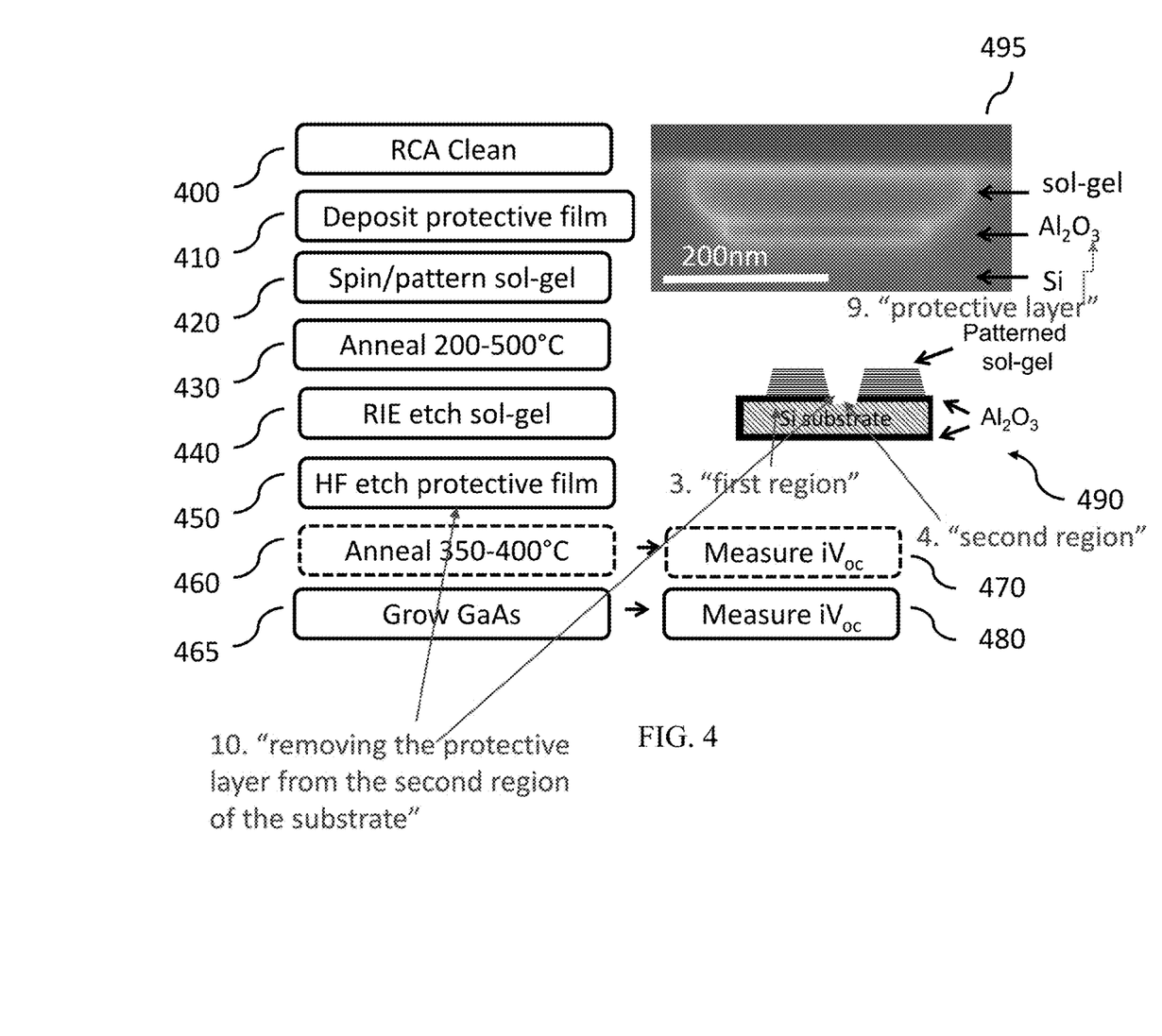
FIG. 4 shows an example in which the forming of the patterned sol-gel layer is modified by forming a passivation layer on the 5 substrate; 3 first region; 4 second region; 9 protective layer; 10 removing the protective layer from the second region of the substrate.

Before forming the patterned 7 sol-gel material on the 5 substrate, a passivating layer or other 9 protective layer may be formed on the 5 substrate. Such a layer may be useful to protect the Si 5 substrate from damage, such as damage due to diffusion of impurities, or to reduce charge carrier recombination at the heteroepitaxial growth interface. FIG. 4 shows an example in which the forming of the patterned sol-gel layer is modified by first forming an $Al_2O_3$ passivation layer on the 5 substrate. As shown in FIG. 4, the 5 substrate may first be cleaned by the Radio Corporation of America (RCA) cleaning method (400). A uniform protective coating of a material such as $SiO_2$, $Al_2O_3$, or $SiN_x$ may be deposited on the 5 substrate by any suitable method, such as plasma enhanced chemical vapor deposition (PECVD) or atomic layer deposition (ALD) (410). The 7 sol-gel material is then applied and patterned as discussed above (420). The 7 sol-gel material may be annealed at a suitable temperature, such as between 200° C. and 500° C. (430). The 7 sol-gel material may then be etched by RIE or other dry etch techniques (440). In addition, the passivation layer may be selectively etched using RIE and/or dilute (<1%) HF etching (450), in order to remove the passivation layer from regions of the 5 substrate that are not covered by the patterned 7 sol-gel material.

As discussed above, FIG. 4 shows a method of patterning a bilayer sol-gel $SiO_2$/9 protective layer mask (such as ALD-deposited $Al_2O_3$), which can be used both to selectively template III-V growth and to passivate the Si surface. Quasi-steady-state photoconductance (QSSPC) measurements show that these patterned passivation layers with sol-gel $SiO_2$ coatings are effective passivation layers for silicon. FIG. 4 also shows a schematic 490 of the intended architecture and an SEM image 495 confirming that the exposed areas of the protective $Al_2O_3$ layer were fully etched. The minority carrier properties of Czochralski (Cz) Si(100) wafers were tested using a Sinton WT-120TC photoconductance tool before and after patterning the 9 protective layer. All Sinton measurements were carried out with the patterned side facing away from the light source, to remove any impact of the optical properties of the patterned sol-gel layer. The implied open-circuit voltage $V_{oc}$ (i$V_{oc}$) for Cz wafers with blanket $Al_2O_3$ passivation was ~700 mV. Fully 10 removing the $Al_2O_3$ passivation from one side of the wafer reduced the i$V_{oc}$ to 570 mV. For samples patterned with an array of ~200 nm holes with a 500 nm pitch (resulting in ~14% removal of the $Al_2O_3$ by area), the measured i$V_{oc}$ was >600 mV (measured at 470 after annealing the sample at a temperature between 350° C. and 400° C. at 460). Although partial removal of the passivating layer decreases the measured i$V_{oc}$, the remaining $Al_2O_3$ passivates the Si better than a fully etched Si surface. A similar trend in performance is expected for passivating layers that are stable at high temperatures compatible with MOCVD growth (measured at 480 after growing GaAs on the sample at 465). These experiments were carried out using as-received Si wafers ($N_D \cdot 2\times 10^{14}$ cm$^{-3}$). Fully processed Si devices that have the benefit of field passivation are expected to be even more tolerant of partial removal of the passivating layers. Limiting the area fraction of Si that is exposed during SNIL may improve the measured minority carrier properties of the Si. This enables the integration of passivating layers into a III-V/Si tandem solar cell, to better control the surface recombination at the interface between materials. Further, growing III-V layers on sol-gel patterned Si reduces the amount of interdiffusion between the two materials, as compared to nucleating on planar (unpatterned) Si surfaces. These patterned interfacial layers reduce unintentional doping of Si into the III-V as well as group V (e.g. As) doping into Si, enabling greater control of heteroepitaxial devices.

As shown in FIG. 1, once the patterned 7 sol-gel material has been formed on a 3 first region of the 5 substrate (100), a 2 semiconductor material is deposited on a 4 second region of the 5 substrate that is adjacent to the 3 first region of the 5 substrate (110). The 2 semiconductor material may be deposited by any suitable method, such as MOCVD or hydride vapor phase epitaxy (HVPE). For example, GaAs growth may be carried out by using arsine ($AsH_3$) as an As precursor, and by using trimethylgallium (TMGa) and/or triethylgallium (TEGa) as a Ga precursor. The 2 semiconductor material is deposited by SAG. The growth conditions, including the precursor flow rates, the V/III ratio, and/or the temperature, may be selected such that the 2 semiconductor material nucleates only on the portion of the 5 substrate that is not covered by the patterned 7 sol-gel material. For example, GaAs may be grown at a temperature between 400° C. and 600° C. by nucleating at low flow rates of TEGa, such as between 5 and 20 sccm, that result in a growth rate of 0.5 to 2 microns per hour of equivalent planar growth, and a moderate V/III ratio, such as between 10 and 250. In this example, the V/III ratio is the ratio of As to Ga in the precursors. At higher V/III ratios, each Ga atom is effectively pinned down to the surface, causing non-epitaxial nucleation. At lower V/III ratios, clumps of Ga may form that are unable to diffuse to the Si for epitaxy.

In one example, growth of GaAs may be carried out in a low pressure (50 Torr) MOCVD reactor. Before depositing the GaAs, a Si 5 substrate patterned with a 7 sol-gel material may be etched with dilute HF (such as 1% HF in $H_2O$) to remove native oxide from the exposed Si surface, and rinsed with deionized (DI) water. MOCVD growth may be initiated by first annealing the patterned 5 substrate under $AsH_3$ at ~700° C. for 2 minutes, a process that creates a single domain As/Si terminated surface on offcut Si(100) wafers. For example, the 5 substrate temperature may then be lowered to less than 500° C. and GaAs growth may be carried out using the Group III and Group V precursors.

Figure 5A:
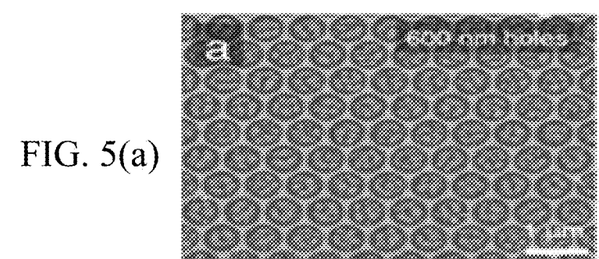
FIGS. 5(a)-5(d) show SEM and TEM images of GaAs grown by SAG on a Si 5 substrate patterned with a 7 sol-gel material.
Figure 5B:
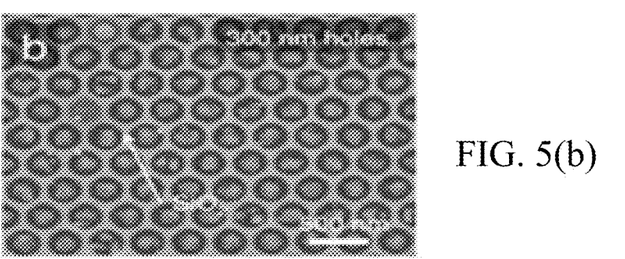
Figure 5C:
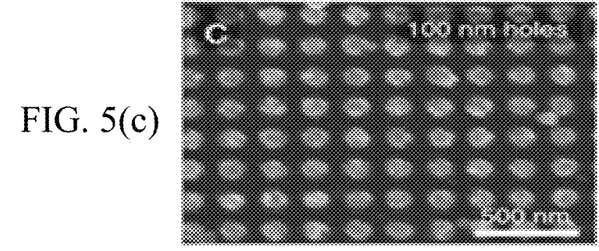
Figure 5D:
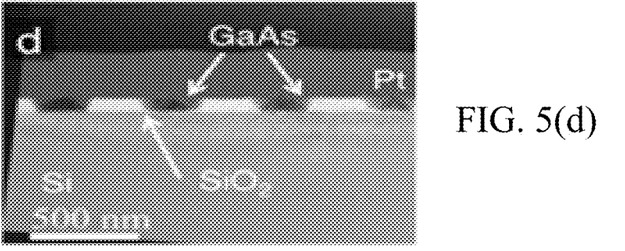

FIGS. 5(a)-5(c) show SEM images of GaAs grown by SAG on a 5 substrate patterned with a 7 sol-gel material. FIG. 5(a) shows an example with 600 nm openings, FIG. 5(b) shows an example with 300 nm openings, and FIG. 5(c) shows an example with 100 nm openings. FIG. 5(d) shows a TEM image of GaAs grown by SAG on a 5 substrate patterned with a 7 sol-gel material. FIG. 5(d) shows an example with 200 nm openings. In these examples, the GaAs was grown for two minutes to observe the nucleation behavior of GaAs at the very early stages of growth. For the large openings shown in FIG. 5(a), it is clear that there are multiple nucleation events within each opening. Under the same growth conditions with smaller openings in FIGS. 5(b)-5(d), the majority of holes only contain a single GaAs island. Moving to even smaller openings will ensure only a single nucleation event per opening and enable further control of nucleation density. Advantageously, the openings may be formed to be less than 50 nm. FIGS. 5(a)-5(d) demonstrate the high selectivity of GaAs nucleation on the exposed Si, and not the patterned 7 sol-gel material.

Figure 6A:
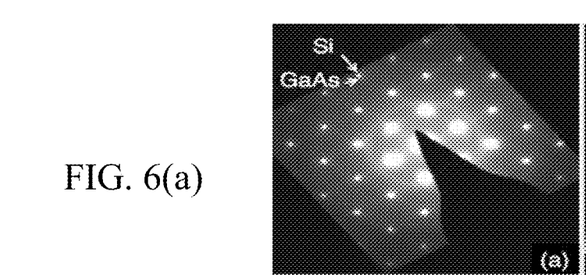
FIGS. 6(a)-6(d) show electron diffraction and cross-section TEM images of single GaAs islands grown by SAG on a Si 5 substrate patterned with a 7 sol-gel material.
Figure 6B:
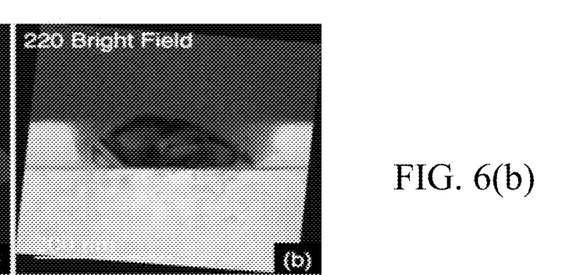
Figure 6C:
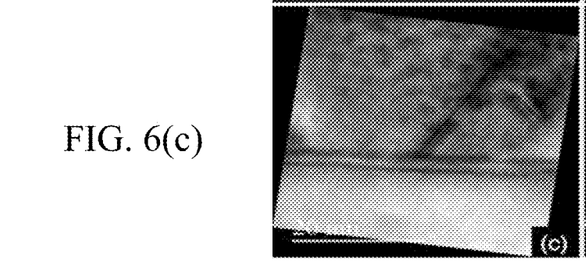
Figure 6D:
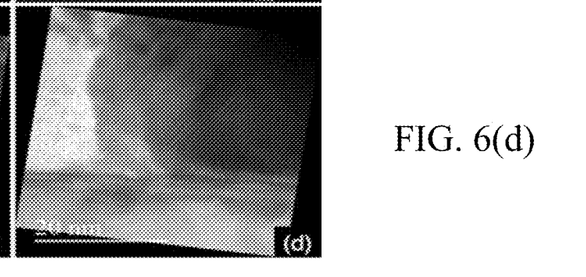

FIGS. 6(a)-6(d) show electron diffraction and cross-section TEM images of single GaAs islands grown on a Si 5 substrate patterned with a 7 sol-gel material. Specifically, FIG. 6(a) shows an electron diffraction image, FIG. 6(b) shows a diffraction-contract image, and FIGS. 6(c) and 6(d) show high-resolution TEM images. These images show that the GaAs is epitaxial with respect to the Si 5 substrate. The diffraction images, which show spot splitting (arrows), indicate that the GaAs is substantially relaxed, even though the islands are less than 200 nm tall. The TEM images also reveal twins that have formed along the {111} planes. A smaller feature size, a higher aspect ratio of the patterned sol-gel buffer layer, and control of the pattern geometry relative to the orientation for the 5 substrate may reduce defect formation and enable coalescence of the islands into a continuous film. By using very small nucleation areas, the defect density and stress due to nucleation of lattice-mismatched materials may be decreased, ultimately decreasing the cost of III-V growth by eliminating the need for a thick metamorphic buffer.

Figure 7A:
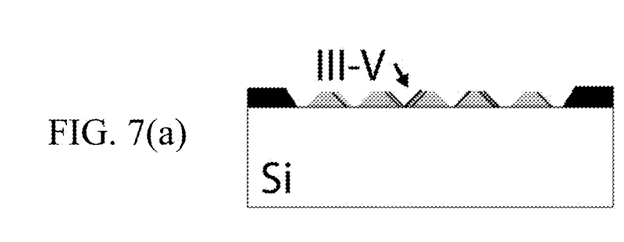
FIGS. 7(a)-7(f) show the SAG and lateral overgrowth of a III-V material on a Si 5 substrate patterned with a 7 sol-gel material.
Figure 7B:
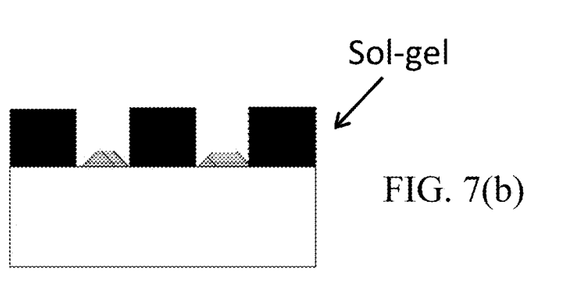
Figure 7C:
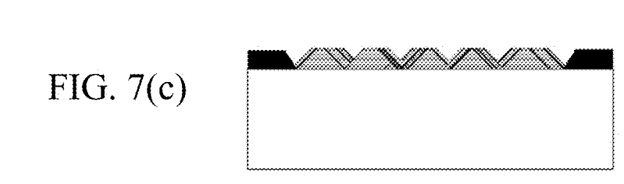
Figure 7D:
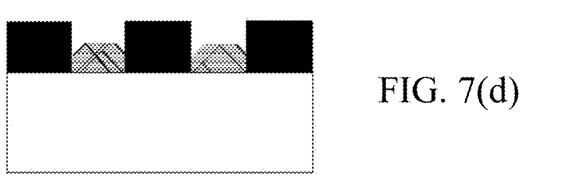
Figure 7E:
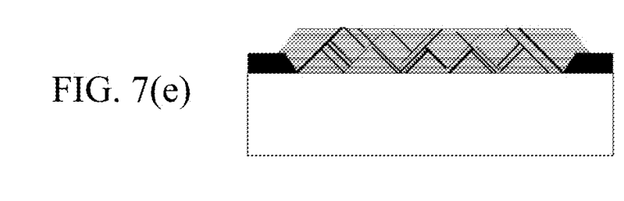
Figure 7F:
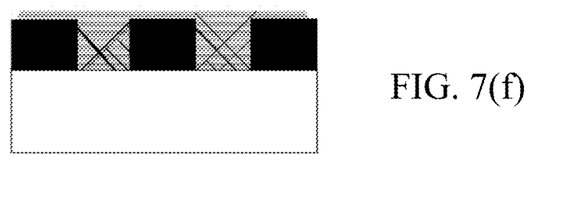
Figure 8:
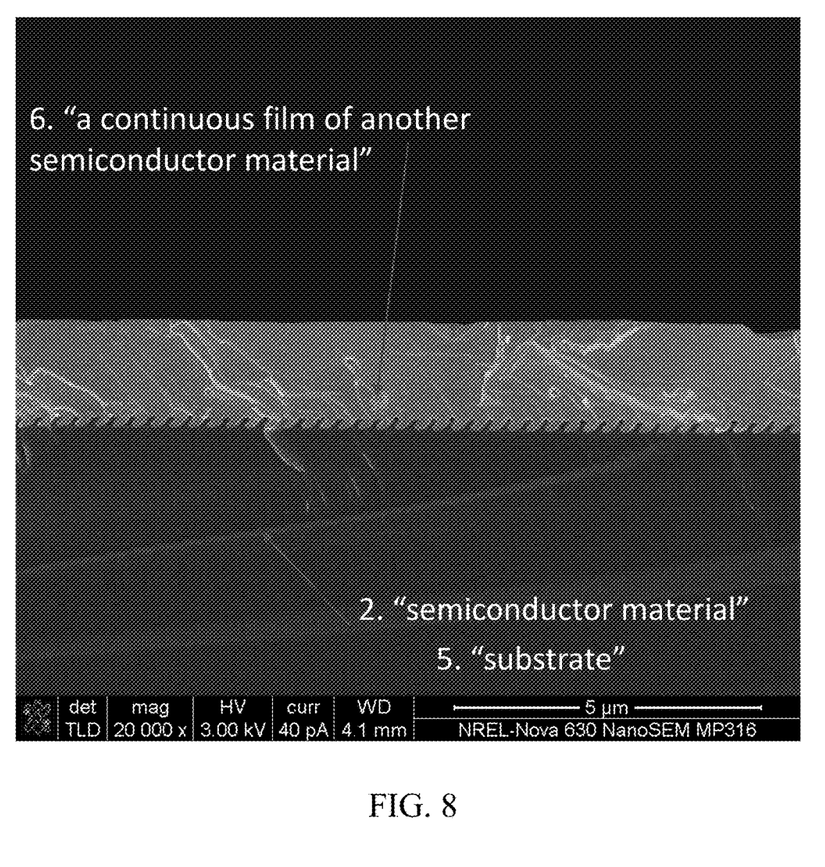
FIG. 8 shows an SEM image of a continuous GaAs film grown on a Si 5 substrate patterned with a 7 sol-gel material; 2 semiconductor material; 5 substrate; and 6 a continuous film of another semiconductor material".

As shown in FIG. 1, after depositing the 2 semiconductor material on the 4 second region of the 5 substrate (110), a 6 continuous film of the 2 semiconductor material may be formed on the 5 substrate (120). Exemplary embodiments of the present invention grow nanoscale islands that will coalesce to form a continuous film, which has lower defect density than if the unpatterned analog was grown. For example, FIGS. 7(a) and 7(b) show schematic Si 5 substrates on which a III-V material has been deposited by SAG onto regions not covered by a patterned 7 sol-gel material, according to the methods discussed above. FIGS. 7(c) and 7(d) show the deposition of additional III-V material in these regions under conditions designed to produce coalesced films of the III-V material. An example of such conditions would be flowing 5-20 sccm TEGa at a temperature between 600° C. and 700° C. and a V/III ratio between 100 and 300 for a growth rate between 0.5 and 2 µm per hour. FIGS. 7(e) and 7(f) show the lateral overgrowth of the III-V material onto the 7 sol-gel material, resulting in a 6 continuous film that covers the 5 substrate. The lateral overgrowth may be achieved by increasing the growth time in the MOCVD reactor. Further, the growth rate, temperature, and III/V ratio may be controlled in order to influence the morphology of the III-V semiconductor growth. For example, a 6 continuous film can be grown by flowing 10-200 sccm TEGa at a 5 substrate temperature between 600° C. and 700° C. and a V/III ratio between 100 and 500 for a growth rate between 1 and 20 microns per hour. By increasing the temperature of the 5 substrate and the V/III ratio during coalescence and lateral overgrowth, as compared to the initial SAG growth phase, the crystallinity of the film may be improved. An SEM image of a continuous GaAs film grown on a Si 5 substrate patterned with a 7 sol-gel material is shown in FIG. 8. Due to the characteristics of the growth methods discussed above, the GaAs film is grown without using a metal catalyst.

Using SNIL to pattern a 7 sol-gel material on a Si 5 substrate removes the need for low-throughput, high-cost patterning and etching techniques. Controlling the height of the patterned buffer layer also enables some defects to be trapped at sidewalls through aspect ratio trapping (ART). Defects that form at the Si/III-V interface due to the lattice and polarity mismatch between the materials will propagate through the film, but can be trapped by the sidewalls of the buffer layer, as many crystallographic defects propagate along crystallographic directions that are not perpendicular to the surface of the 5 substrate. Controlling the fractional coverage of a patterned buffer layer enables the interface area between the two materials to be minimized, which has the potential to impact the surface recombination at the Si/III-V interface. Further, the patterned 7 sol-gel material influences the background doping of the GaAs material grown by SAG. The patterned 7 sol-gel material decreases the extent of the Si/GaAs interface. Because diffusion between Si and GaAs occurs at growth temperatures, the amount of Si that is available to react with the GaAs is limited.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method comprising:
    first forming a protective layer on a first region and a second region of a substrate; and further comprising the additional steps of forming a pattern of a sol-gel material on the first region of the substrate; and
    then removing the protective layer from the second region of the substrate; and
    then depositing a semiconductor material on the second region of the substrate by selective area growth comprising nucleating the semiconductor material at a growth rate between 0.5 and 2.0 microns per hour and a V/III ratio between 10 and 250, wherein the second region is adjacent to the first region; and
    wherein the semiconductor material and the substrate are lattice mismatched.

2. The method according to claim 1, wherein the depositing of the semiconductor material further comprises:
    after the nucleating of the semiconductor material, increasing a temperature of the substrate; and
    forming a condensed film of the semiconductor material within the second region.

3. The method according to claim 2, further comprising:
    after the depositing of the semiconductor material on the second region, forming a continuous film of another semiconductor material, such that the continuous film extends over the first region and the second region, by lateral overgrowth of the another semiconductor material.

4. The method according to claim 3, wherein the forming of the continuous film of the semiconductor material comprises:
    growing the semiconductor material at a growth rate between 1 and 20 microns per hour and a V/III ratio between 100 and 500.

5. The method according to claim 2, wherein the semiconductor material is deposited and the condensed film is formed by chemical vapor deposition.

6. The method according to claim 5, wherein the semiconductor material is deposited and the film is formed by metalorganic chemical vapor deposition.

7. The method according to claim 1, wherein the forming of the pattern of the sol-gel material comprises:
    coating the sol-gel material onto the substrate;
    stamping the sol-gel material with a polymer stamp; and
    annealing the sol-gel material.

8. The method according to claim 1, wherein the semiconductor material and the substrate are different materials.

9. The method according to claim 1, wherein the semiconductor material comprises a III-V material.

10. The method according to claim 9, wherein the semiconductor material comprises GaAs.

11. The method according to claim 9, wherein the substrate comprises Si.

12. The method according to claim 1, wherein the protective layer is a passivating layer.

13. The method according to claim 1, further comprising:
    after the forming of the pattern of the sol-gel material, increasing a density of the sol-gel material by heating the sol-gel material.

14. The method according to claim 1, further comprising:
    after the forming of the pattern of the sol-gel material, performing a dilute HF etch to remove native oxide from the sol-gel material.

15. The method according to claim 1, wherein the semiconductor material is uncatalyzed.

* * * * *